United States Patent
Hsu et al.

(10) Patent No.: US 9,761,703 B1
(45) Date of Patent: Sep. 12, 2017

(54) WIDE BANDGAP SEMICONDUCTOR DEVICE WITH ADJUSTABLE VOLTAGE LEVEL

(71) Applicant: Hestia Power Inc., Hsinchu (TW)

(72) Inventors: Fu-Jen Hsu, Hsinchu (TW);
Chien-Chung Hung, Hsinchu (TW);
Yao-Feng Huang, Hsinchu (TW);
Cheng-Tyng Yen, Hsinchu (TW);
Chwan-Ying Lee, Hsinchu (TW)

(73) Assignee: HESTIA POWER INC., Hsinchu (TW)

( * ) Notice: Subject to any disclaimer, the term of this patent is extended or adjusted under 35 U.S.C. 154(b) by 0 days.

(21) Appl. No.: 15/208,052

(22) Filed: Jul. 12, 2016

(51) Int. Cl.

| | |
|---|---|
| *H01L 29/15* | (2006.01) |
| *H01L 29/778* | (2006.01) |
| *H01L 29/16* | (2006.01) |
| *H01L 29/739* | (2006.01) |
| *H01L 29/20* | (2006.01) |
| *H01L 29/78* | (2006.01) |
| *H01L 27/06* | (2006.01) |

(52) U.S. Cl.
CPC ...... *H01L 29/7786* (2013.01); *H01L 27/0629* (2013.01); *H01L 29/1608* (2013.01); *H01L 29/2003* (2013.01); *H01L 29/7395* (2013.01); *H01L 29/7838* (2013.01)

(58) Field of Classification Search
CPC ............. H01L 29/7786; H01L 29/7838; H01L 29/7395
USPC ......................................... 257/77
See application file for complete search history.

(56) References Cited

U.S. PATENT DOCUMENTS

| 8,084,783 B2 | 12/2011 | Zhang |
| 8,624,662 B2 | 1/2014 | Parikh et al. |

*Primary Examiner* — Anthony Ho
(74) *Attorney, Agent, or Firm* — Muncy, Geissler, Olds & Lowe, P.C.

(57) ABSTRACT

A wide bandgap semiconductor device with an adjustable voltage level includes a wide bandgap semiconductor power unit and a level adjusting unit. The wide bandgap semiconductor power unit includes a source terminal, to which the level adjusting unit is electrically connected. The level adjusting unit provides a level shift voltage via the source terminal to adjust a driving voltage level of the wide bandgap semiconductor power unit. By adjusting the driving voltage level of the wide bandgap semiconductor power unit using the level adjusting unit, the wide bandgap semiconductor device may serve as a high-voltage enhancement-mode transistor to achieve reduced costs and an increased switching speed.

19 Claims, 6 Drawing Sheets

WIDE BANDGAP SEMICONDUCTOR DEVICE WITH ADJUSTABLE VOLTAGE LEVEL

FIELD OF THE INVENTION

The present invention relates to a wide bandgap semiconductor device, and particularly to a wide bandgap semiconductor device with an adjustable voltage level.

BACKGROUND OF THE INVENTION

Among semiconductor devices, wide bandgap semiconductor devices, featuring advantages of superior saturation electron velocity, pressure field and heat dissipation coefficient, have attracted many industrialists or research organizations for further development. Currently, some most commonly used wide bandgap semiconductor devices are gallium nitride (GaN) and silicon carbide (SiC) semiconductor devices.

Taking a high electron mobility transistor (HEMT) for example, it is characterized by having a high frequency, a high breakdown voltage and a low loss. Common HEMTs include pure enhancement-mode high electron mobility transistors (pure E-mode HEMTs), transistors having a embedded clamping diode design, and cascoded low-voltage metal-oxide-semiconductor field-effect-transistors (LV-MOSFETs).

Among the above, a pure E-mode HEMT has a difficult manufacturing process, and includes a gate insulation layer having a weak structure that thus disfavors applications. In addition to a drawback of being controlled by only pulse width modulation (PWM), a transistor having an embedded clamping diode design further suffers from issues of being in a normally on state when activated and requiring precise gate driver designs. Further, a cascoded LV-MOSFET has issues of having high packaging costs, a high conduction impedance and a slow switching speed, and is not considered as an optimal solution for E-mode HEMTs. A structure of a cascoded LV-MOSFET may be referred from below.

The U.S. Pat. No. 8,624,662 B2 discloses an electronic device including a depletion-mode transistor, an enhancement-mode transistor, and a single package. The single package encases the depletion-mode transistor and the enhancement-mode transistor. A source electrode of the depletion-mode transistor is electrically connected to a drain electrode of the enhancement-mode transistor, a drain electrode of the depletion-mode transistor is electrically connected to a drain lead of the single package, a gate electrode of the enhancement-mode transistor is electrically connected to a gate lead of the single package, a gate electrode of the depletion-mode transistor is electrically connected to an additional lead of the single package, and a source electrode of the enhancement-mode transistor is electrically connected to a conductive structural portion of the single package. The gate electrode of the depletion-mode transistor is not electrically connected to every electrode of every transistor encased in the single package.

Alternatively, the U.S. Pat. No. 8,084,783 B2 discloses an enhancement-mode GaN FET device including a main GaN FET and a switching element. The switching element and the main GaN FET are connected in a cascoded configuration. The switching device includes an FET connected in parallel to a diode switching structure. Wherein, the main GaN FET cascoded with the switching device operates as an enhancement-mode GaN FET device, and the GaN FET is monolithically integrated into the same substrate as the FET and the diode switching structure of the switching device.

A conventional wide bandgap power device such as an SiC JFET and GaN HEMT device, although featuring advantages of having a high switching speed, a high voltage tolerance and a low conduction impedance, frequently encounters a bottleneck when manufactured as an enforcement-mode device. Further, in actual applications of a power device, due to an extremely large power carried by the power device, the circuit may become short-circuited in the event of a control issue when used as a normally on device (a depletion-mode device). Thus, an enormous current caused may pass through to not only damage the circuit but also potentially threatens the safety of the operator.

For example, taking a GaN HEMT for instance, due to its 2-dimensional electron gas (2DEG) property, the manufacturing of depletion-mode devices is much more low-cost and simpler than the manufacturing of enhancement-mode devices. Thus, manufacturers have introduced conventional technologies of silicon devices to change the normally on characteristic of a GaN HEMT device using a cascoded configuration, so that such device may be applied as a composite normally off device. While providing the characteristic of having a high breakdown voltage as a wide bandgap transistor, such types of devices are capable of simultaneously driving the overall device by a driving approach as a conventional siliceous MOSFET. However, as carried devices may still be siliceous devices, the switching speed may not be quite equal to that of pure wide bandgap devices. Further, due to the cascoded configuration, the conduction resistance of crystals is also increased, such that the advantages of wide bandgap devices cannot be effectively exercised.

In conclusion, known from the examples of the above enhancement-mode HEMTs, there is a need for a solution for improving technologies of wide bandgap semiconductor devices.

SUMMARY OF THE INVENTION

It is a primary object of the present invention is to solve manufacturing and operation issues of a conventional wide bandgap semiconductor devices.

To achieve the above object, the present invention provides a wide bandgap semiconductor device with an adjustable voltage level. The wide bandgap semiconductor device with an adjustable voltage level of the present invention includes a wide bandgap semiconductor power unit and a level adjusting unit. The wide bandgap semiconductor power unit includes a source terminal, and the level adjusting unit is electrically connected to the source terminal. The level adjusting unit provides a shift voltage via the source terminal to adjust a driving voltage level of the wide bandgap semiconductor power unit.

To achieve the above object, the present invention further provides a wide bandgap semiconductor device with an adjustable voltage level. The wide bandgap semiconductor device with an adjustable voltage level of the present invention includes a depletion-mode high electron mobility transistor (HEMT) unit and a level adjusting unit. The depletion-mode HEMT unit includes a source terminal, and the level adjusting unit is electrically connected to the source terminal. The level adjusting unit provides a shift voltage via the source terminal to adjust a gate-source voltage of the depletion-mode HEMT unit.

To achieve the above object, the present invention further provides a wide bandgap semiconductor device with an adjustable voltage level. The wide bandgap semiconductor device with an adjustable voltage level of the present invention includes a depletion-mode field-effect-transistor (FET) unit and a level adjusting unit. The depletion-mode FET unit includes a source terminal, and the level adjusting unit is electrically connected to the source terminal. The level adjusting unit provides a shift voltage via the source terminal to adjust a gate-source voltage of the depletion-mode FET unit.

It is known from above that, compared to known technologies, the present invention achieve effects below. In the present invention, with the collaboration of the wide bandgap semiconductor power unit and the level adjusting unit, and by adjusting the driving voltage level of the wide bandgap semiconductor power unit using the level adjusting unit, the wide bandgap semiconductor device of the present invention may be used as a high-voltage enhancement-mode transistor that is not formed by a combination of a depletion-mode HEMT and a low-voltage enhancement-mode semiconductor unit as in the prior art. Therefore, compared to a conventional enhancement-mode transistor, the wide bandgap semiconductor device of the present invention has lower costs as well as a higher switching speed.

DETAILED DESCRIPTION OF THE PREFERRED EMBODIMENTS

Details and technical contents of the present invention are given with the accompanying drawings below.

Figure 1:
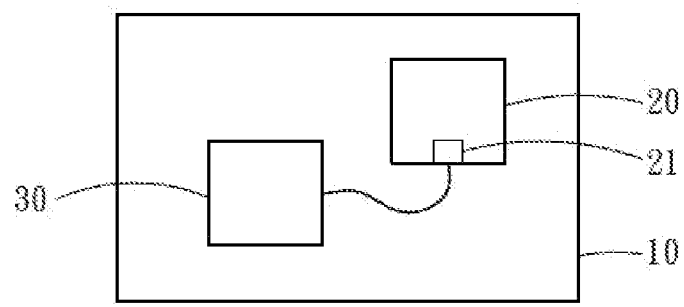
FIG. 1 is a schematic diagram of a wide bandgap semiconductor device according to an embodiment of the present invention.
Figure 2:
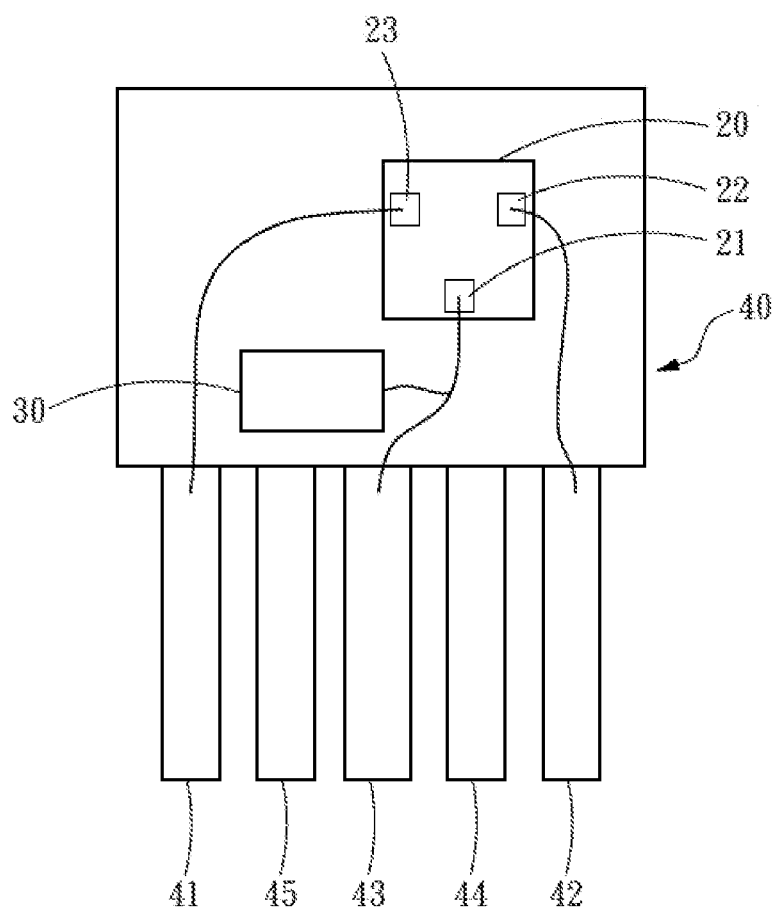
FIG. 2 is a schematic diagram of a package structure of a wide bandgap semiconductor device according to an embodiment of the present invention.

FIG. 1 and FIG. 2 are a schematic diagram of a wide bandgap semiconductor device according to an embodiment of the present invention, and a schematic diagram of a package structure of a wide bandgap semiconductor device according to an embodiment of the present invention. Referring to FIG. 1 and FIG. 2, the present invention provides a wide bandgap semiconductor device with an adjustable voltage level. According to an embodiment, the wide bandgap semiconductor device with an adjustable voltage level includes a substrate 10, a wide bandgap semiconductor power unit 20 and a level adjusting unit 30. The substrate 10 is made of at least one material selected from a group consisting of copper, aluminum and gold. Alternatively, the substrate 10 may also be made of ceramic or resin, and be covered by a conductive path region on a surface thereof. In the embodiment, preferably, the wide bandgap semiconductor power unit 20 and the level adjusting unit 30 are formed in a package structure on the substrate 10, and are integrated in a single package structure 40. In other embodiments, the substrate 10 and the wide bandgap semiconductor power unit 20, and the substrate 10 and the level adjusting unit 30 may be respectively packaged. In the embodiment, the single package structure 40 may include a gate pin 41, a drain pin 42, a source pin 43, a driving power pin 44 and a control source pin 45. These pins are in a parallel arrangement, and extend and protrude out of the single package structure 40.

The wide bandgap semiconductor power unit 20 is disposed on the substrate 10, and may be a metal-oxide-semiconductor field-effect-transistor (MOSFET), e.g., at least one selected from a group consisting of a depletion-mode FET or an enhancement-mode FET, a junction field-effect-transistor (JFET), a high electron mobility transistor (HEMT), an insulated gate bipolar transistor (IBGT). In the present invention, the wide bandgap semiconductor power unit 20 includes a source terminal 21, a drain terminal 22 and a gate terminal 23. The gate pin 41, the drain pin 42 and the source pin 43 are electrically connected to the gate terminal 23, the drain terminal 22 and the source terminal 21 of the wide bandgap semiconductor power unit 20, respectively.

The level adjusting unit 30 is disposed on the substrate 10, and is electrically connected to the source terminal 21 and the source pin 43. The level adjusting unit 30 provides a level shift voltage, and adjusts a driving voltage level of the wide bandgap semiconductor power unit 20 through the source terminal 21, such that the wide bandgap semiconductor device achieves effects of a high-voltage enhancement-mode transistor device. In the embodiment, taking a depletion-mode HEMT unit for example, the driving voltage level may be a gate-source voltage of the depletion-mode HEMT unit.

In the present invention, as shown from FIG. 3A to FIG. 7B, the wide bandgap semiconductor power unit 20 is the depletion-mode HEMT unit, and the level adjusting unit 30 is formed by a first resistor 31, a second resistor 32 or a voltage regulating diode 33. For example, the voltage regulating diode 33 may be a Zener diode.

Figure 3A:
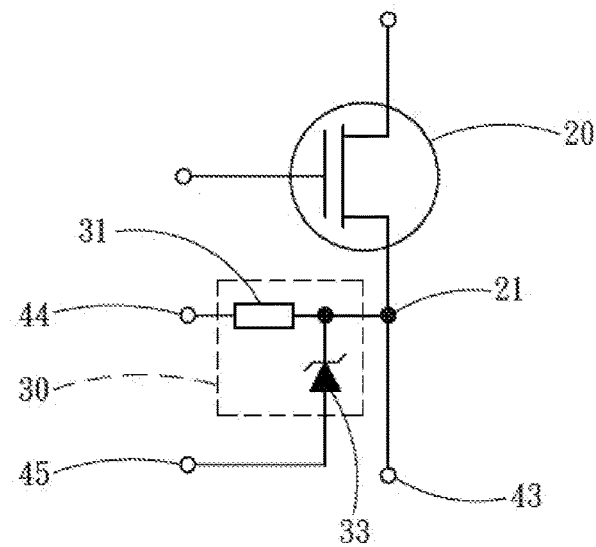
FIG. 3A is a circuit schematic diagram of a first resistor and a voltage regulating diode as a level adjusting unit of a wide bandgap semiconductor device according to a first embodiment of the present invention.
Figure 3B:
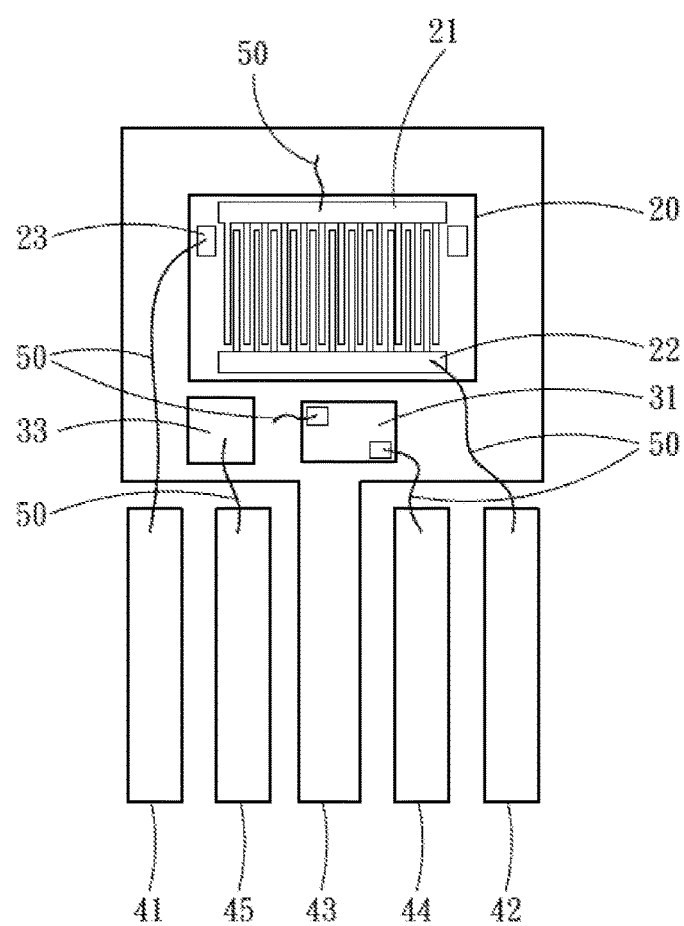
FIG. 3B is a schematic diagram of a package structure of a first resistor and a voltage regulating diode as a level adjusting unit of a wide bandgap semiconductor device according to the first embodiment of the present invention.

In the first embodiment, as shown in FIG. 3A, the level adjusting unit 30 is formed by the first resistor 31 and the voltage regulating diode 33. Two ends of the first resistor 31 are electrically connected to the driving power pin 44, and the source terminal 21 and the source pin 43, respectively. An anode terminal of the voltage regulating diode 33 is electrically connected to the control source pin 45, and a cathode terminal of the voltage regulating diode 33 is electrically connected to the source terminal 21 and the source pin 43. Referring to FIG. 3B, the components are electrically connected by a plurality of conductive leads 50. Further, the gate terminal 23 is electrically connected to the gate pin 41 via the conductive lead 50, the drain terminal 22 is electrically connected to the drain pin 42 via the conductive lead 50, the source terminal 21 is electrically connected to the source pin 43 via the conductive lead 50, the anode of the voltage regulating diode 33 is electrically connected to the control source pin 45 via the conductive lead 50, and two ends of the first resistor 31 are electrically connected to the driving power pin 44 and the source pin 43 via the conductive lead 50, respectively. It should be noted that, the cathode of the voltage regulating diode 33 is directly in contact with and thus electrically connected to the source pin 43.

Figure 4A:
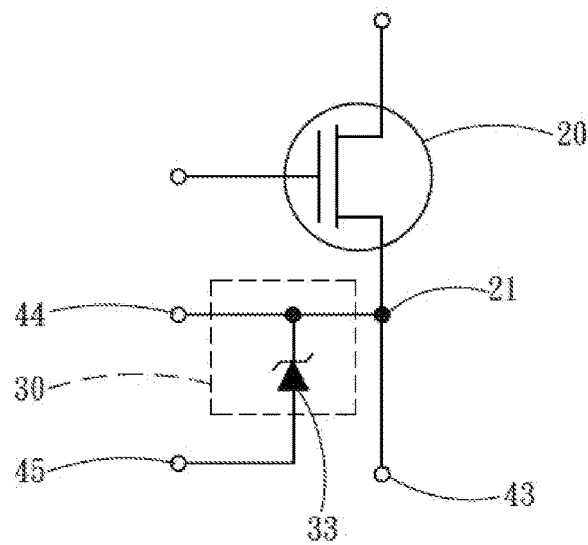
FIG. 4A is a circuit schematic diagram of a voltage regulating diode as a level adjusting unit of a wide bandgap semiconductor device according to a second embodiment of the present invention.
Figure 4B:
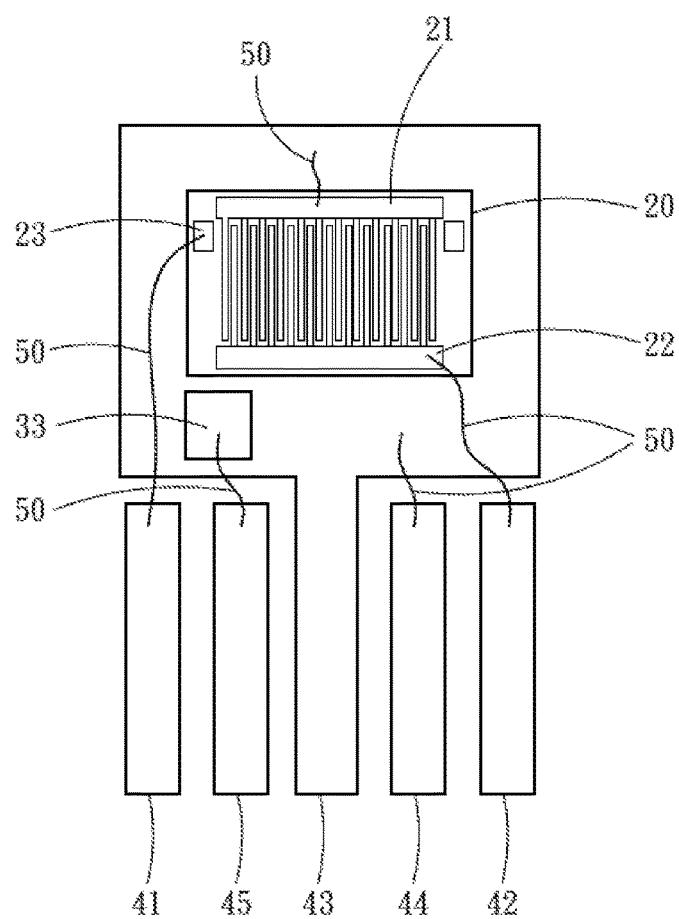
FIG. 4B is a schematic diagram of a package structure of a voltage regulating diode as a level adjusting unit of a wide bandgap semiconductor device according to the second embodiment of the present invention.

In a second embodiment, as shown in FIG. 4A, one difference of the embodiment from the first embodiment is that, the level adjusting unit 30 includes only the voltage regulating diode 33. Thus, the cathode terminal of the voltage regulating diode 33 is simultaneously electrically connected to the source terminal 21, the source pin 43 and the driving power pin 44, and the anode terminal of the voltage regulating diode 33 is electrically connected to the control source pin 45. Referring to FIG. 4B, as the level adjusting unit 30 includes only the voltage regulating diode 33, the driving power pin 44 is electrically connected to the source pin 43 directly via the conductive lead 50. Details of other connections are identical to those of the first embodiment, and shall be omitted herein.

Figure 5A:
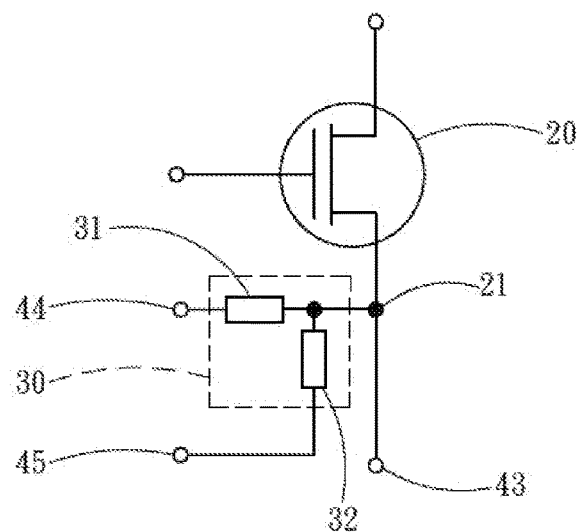
FIG. 5A is a circuit schematic diagram of a first resistor and a second resistor as a level adjusting unit of a wide bandgap semiconductor device according to a third embodiment of the present invention.
Figure 5B:
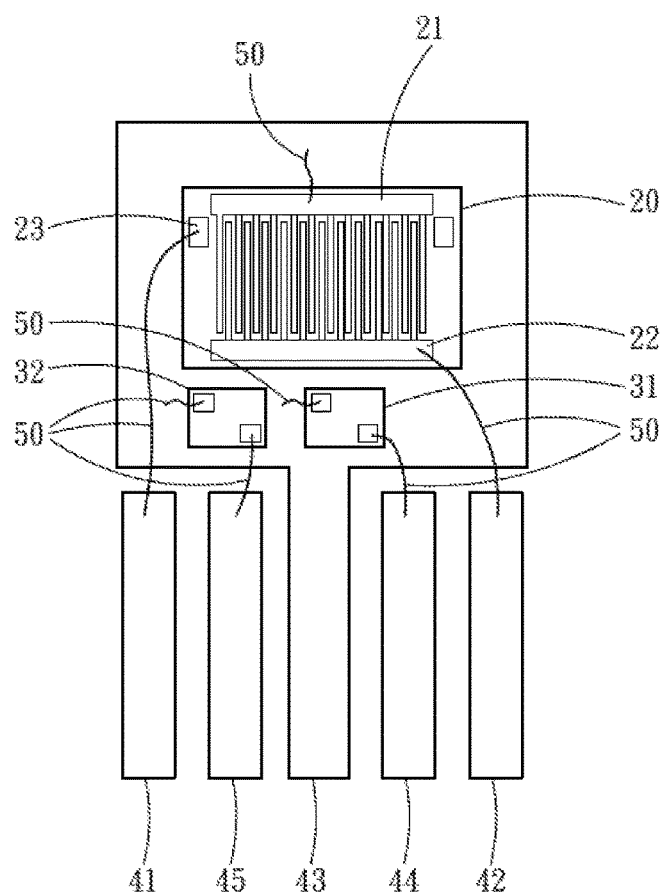
FIG. 5B is a schematic diagram of a package structure of a first resistor and a second resistor as a level adjusting unit of a wide bandgap semiconductor device according to the third embodiment of the present invention.

In a third embodiment, as shown in FIG. 5A, one difference of this embodiment from the first embodiment is that, the voltage regulating diode 33 of the level adjusting unit 30 is replaced by the second resistor 32. Thus, one end of the second resistor 32 is electrically connected to the control source pin 45, and the other end of the second resistor 32 is electrically connected to the source terminal 21 and the source pin 43. Referring to FIG. 5B, two ends of the second resistor 32 are electrically connected to the source pin 43 and the control source pin 45 via the conductive lead 50, respectively. Details of other connections are identical to those of the first embodiment, and shall be omitted herein.

Figure 6A:
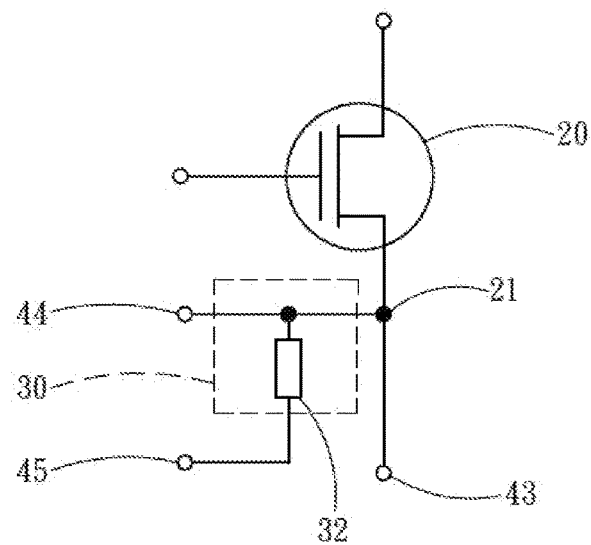
FIG. 6A is a circuit schematic diagram of a second resistor as a level adjusting unit of a wide bandgap semiconductor device according to a fourth embodiment of the present invention.
Figure 6B:
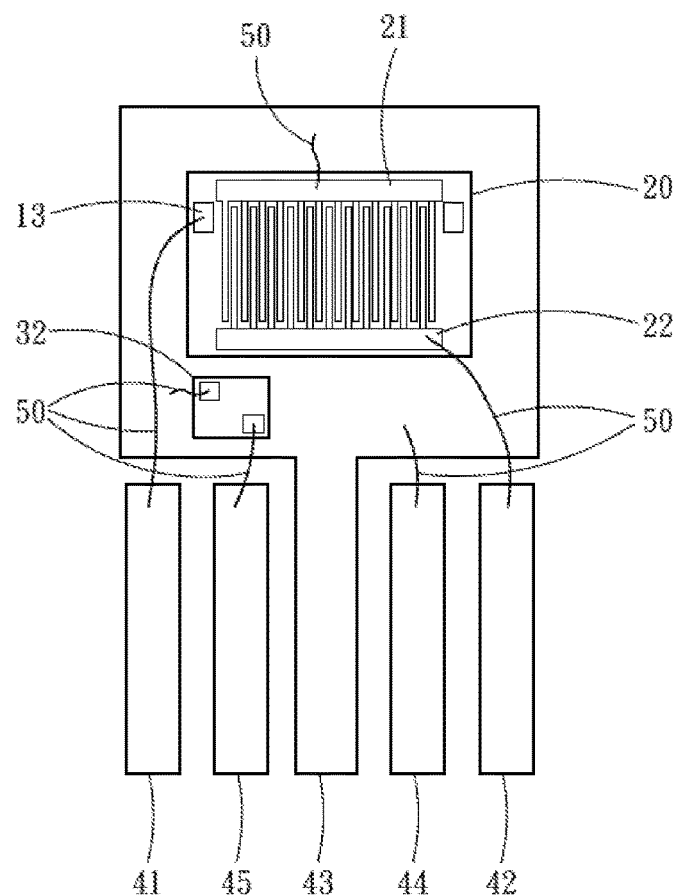
FIG. 6B is a schematic diagram of a package structure of a second resistor as a level adjusting unit of a wide bandgap semiconductor device according to the fourth embodiment of the present invention.

In a fourth embodiment, as shown in FIG. 6A, one difference of this embodiment from the second embodiment is that, the level adjusting unit 30 includes only the second resistor 32. Thus, one end of the second resistor 32 is simultaneously electrically connected to the source terminal 21, the source pin 43 and the driving power pin 44, and the other end of the second resistor 32 is electrically connected to the control source pin 45. Referring to FIG. 6B, as the level adjusting unit 30 includes only the second resistor 32, one end of the second resistor 32 is electrically connected to the source pin 43 via the conductive lead 50 and the other end of the second resistor 32 is electrically connected to the control source pin 45 via the conductive lead 50. Details of other connections are identical to those of the second embodiment, and shall be omitted herein.

Figure 7A:
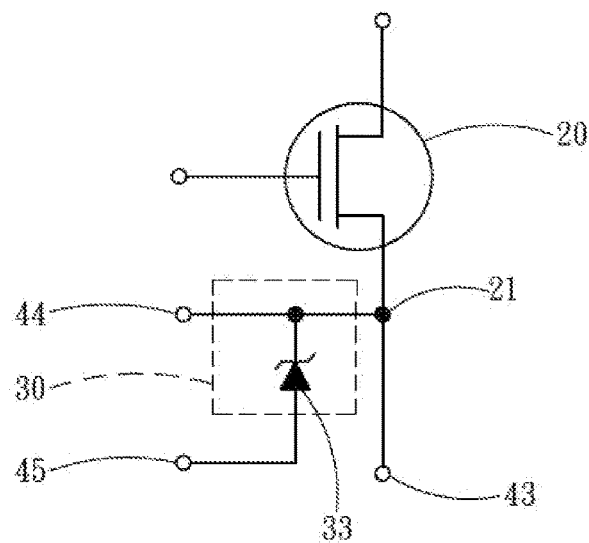
FIG. 7A is a circuit schematic diagram of a voltage regulating diode as a level adjusting unit of a wide bandgap semiconductor device according to a fifth embodiment of the present invention.
Figure 7B:
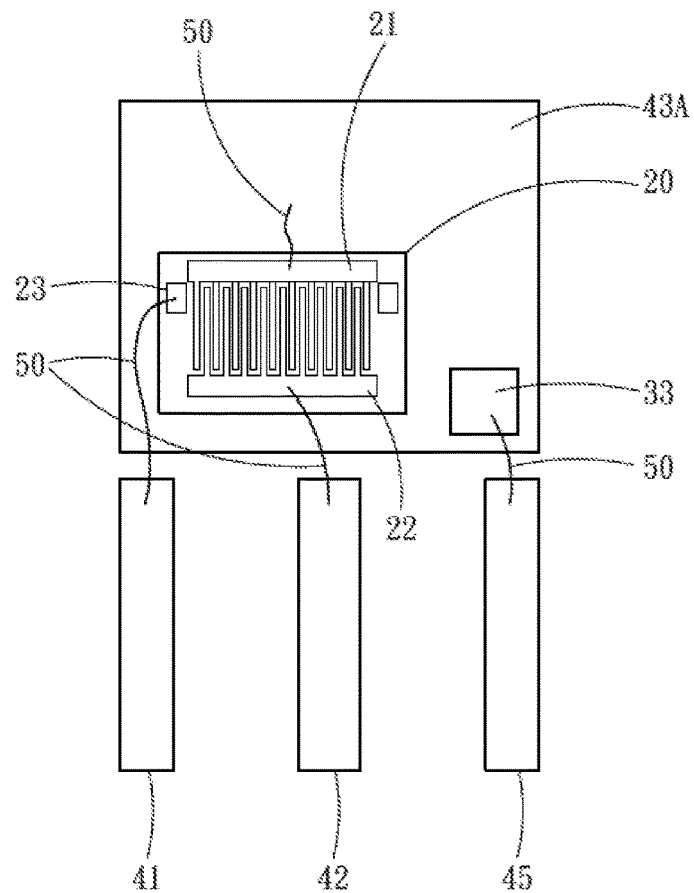
FIG. 7B is a schematic diagram of a package structure of a voltage regulating diode as a level adjusting unit of a wide bandgap semiconductor device according to the fifth embodiment of the present invention.

In a fifth embodiment, as shown in FIG. 7A and FIG. 7B, one difference of this embodiment from the second embodiment is that, the source pin 43 and the driving power pin 44 are modified. Primarily, the T-shaped source pin 43 of the second embodiment is replaced by a rectangular source pin 43A, and the driving power pin 44 is removed, so as to increase respective distances between the gate pin 41, the drain pin 42 and the control source pin 45.

In practice, taking the first embodiment of the present invention for example, again referring to FIG. 3A and FIG. 3B, when power passes via the driving power pin 44 through the first resistor 31 and causes the voltage regulating diode 33 to generate a breakdown effect, the voltage level between the source terminal 21 (the cathode terminal of the voltage regulating diode 33) and the control source pin 45 (the anode of the voltage regulating diode 33) is maintained at the level shift voltage. For the gate pin 41, the level shift voltage achieves an effect of voltage level adjustment. The above example of the first resistor 31 coordinating with the voltage regulating diode 33 is for explaining the present invention, and is not construed as a limitation to the present invention, given that a level adjustor of the level shift voltage is provided.

In conclusion, in the present invention, the wide bandgap semiconductor power unit and the level adjusting unit are disposed on the substrate to form the wide bandgap semiconductor device. By adjusting the driving voltage level of the wide bandgap semiconductor power unit using the level adjusting unit, the wide bandgap semiconductor device of the present invention may be used as a high-voltage enhancement-mode transistor that is not formed by a combination of a high-voltage depletion-mode semiconductor unit and a low-voltage enhancement-mode semiconductor unit as in the prior art. Therefore, compared to a conventional enhancement-mode transistor device, the wide bandgap semiconductor device of the present invention not only provides lower packaging costs and a high switching speed, but also has a more convenient driving approach and a lower conduction resistance. Further, compared to a pure enhancement-mode transistor device, the wide bandgap semiconductor device of the present invention further achieves a higher breakdown voltage under the premise that the structure of the gate insulation layer is maintained with good stability.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A wide bandgap semiconductor device with an adjustable voltage level, comprising:
 a wide bandgap semiconductor power unit, comprising a source terminal; and
 a level adjusting unit, electrically connected to the source terminal;
 wherein, the level adjusting unit provides a level shift voltage via the source terminal to adjust a driving voltage level of the wide bandgap semiconductor power unit,
 wherein the wide bandgap semiconductor power unit and the level adjusting unit are packaged in a single package structure, and the single package structure comprises a gate pin, a drain pin, a source pin, a driving power pin and a control source pin, and the gate pin, the drain pin and the source pin are electrically connected to a gate terminal, a drain terminal and a source terminal of the wide bandgap semiconductor power unit, respectively.

2. The wide bandgap semiconductor device with an adjustable voltage level of claim 1, wherein the wide bandgap semiconductor power unit is selected from a group consisting of a metal-oxide-semiconductor field-effect-transistor (MOSFET), a junction field-effect-transistor (JFET), a high electron mobility transistor (HEMT), and an insulated gate bipolar transistor (IBGT).

3. The wide bandgap semiconductor device with an adjustable voltage level of claim 1, wherein the level adjusting unit is formed by a first resistor and a voltage regulating diode, two ends of the first resistor are electrically connected to the driving power pin and the source terminal, respectively, and an anode terminal and a cathode terminal of the voltage regulating diode are electrically connected to the control source pin and the source terminal, respectively.

4. The wide bandgap semiconductor device with an adjustable voltage level of claim 1, wherein the level adjusting unit is formed by a first resistor and a second resistor, two ends of the first resistor are electrically connected to the driving power pin and the source terminal, respectively, and two ends of the second resistor are electrically connected to the control source pin and the source terminal, respectively.

5. The wide bandgap semiconductor device with an adjustable voltage level of claim 1, wherein the level adjusting unit is a voltage regulating diode, an anode of the voltage regulating diode is electrically connected to the control source pin, and a cathode of the voltage regulating diode is electrically connected to the source terminal and the driving power pin.

6. The wide bandgap semiconductor device with an adjustable voltage level of claim 1, wherein the level adjusting unit is a second resistor, one end of the second resistor is electrically connected to the control source pin, and one other end of the second resistor is electrically connected to the source terminal and the driving power pin.

7. The wide bandgap semiconductor device with an adjustable voltage level of claim 1, further comprising a substrate, on which the wide bandgap semiconductor power unit and the level adjusting unit are disposed.

8. A wide bandgap semiconductor device with an adjustable voltage level, comprising:
 a depletion-mode high electron mobility transistor (HEMT) unit, comprising a source terminal; and
 a level adjusting unit, electrically connected to the source terminal;
 wherein, the level adjusting unit provides a level shift voltage via the source terminal to adjust a gate-source voltage of the depletion-mode HEMT unit,
 wherein the depletion-mode HEMT unit and the level adjusting unit are formed in a single package structure, and the single package structure comprises a gate pin, a drain pin, a source pin, a driving power pin and a control source pin, and the gate pin, the drain pin and the source pin are electrically connected to a gate terminal, a drain terminal and the source terminal of the depletion-mode HEMT unit, respectively.

9. The wide bandgap semiconductor device with an adjustable voltage level of claim 8, wherein the level adjusting unit is formed by a first resistor and a voltage regulating diode, two ends of the first resistor are electrically connected to the driving power pin and the source terminal, respectively, and an anode terminal and a cathode terminal of the voltage regulating diode are electrically connected to the control source pin and the source terminal, respectively.

10. The wide bandgap semiconductor device with an adjustable voltage level of claim 8, wherein the level adjusting unit is formed by a first resistor and a second resistor, two ends of the first resistor are electrically connected to the driving power pin and the source terminal, respectively, and two ends of the second resistor are electrically connected to the control source pin and the source terminal, respectively.

11. The wide bandgap semiconductor device with an adjustable voltage level of claim 8, wherein the level adjusting unit is a voltage regulating diode, an anode of the voltage regulating diode is electrically connected to the control source pin, and a cathode of the voltage regulating diode is electrically connected to the source terminal and the driving power pin.

12. The wide bandgap semiconductor device with an adjustable voltage level of claim 8, wherein the level adjusting unit is a second resistor, one end of the second resistor is electrically connected to the control source pin, and the other end of the second resistor is electrically connected to the source terminal and the driving power pin.

13. The wide bandgap semiconductor device with an adjustable voltage level of claim 8, further comprising a substrate, on which the depletion-mode HEMT unit and the level adjusting unit are disposed.

14. A wide bandgap semiconductor device with an adjustable voltage level, comprising:
 a depletion-mode field-effect-transistor (FET) unit, comprising a source terminal; and
 a level adjusting unit, electrically connected to the source terminal;
 wherein, the level adjusting unit provides a level shift voltage via the source terminal to adjust a gate-source voltage of the depletion-mode FET unit,
 wherein the depletion-mode FET unit and the level adjusting unit are formed in a single package structure, and the single package structure comprises a gate pin, a drain pin, a source pin, a driving power pin and a control source pin, and the gate pin, the drain pin and the source pin are electrically connected to a gate terminal, a drain terminal and the source terminal of the depletion-mode FET unit, respectively.

15. The wide bandgap semiconductor device with an adjustable voltage level of claim 14, further comprising a substrate, on which the depletion-mode FET unit and the level adjusting unit are disposed.

16. The wide bandgap semiconductor device with an adjustable voltage level of claim 14, wherein the level adjusting unit is formed by a first resistor and a voltage regulating diode, two ends of the first resistor are electrically connected to the driving power pin and the source terminal, respectively, and an anode terminal and a cathode terminal of the voltage regulating diode are electrically connected to the control source pin and the source terminal, respectively.

17. The wide bandgap semiconductor device with an adjustable voltage level of claim 14, wherein the level adjusting unit is formed by a first resistor and a second resistor, two ends of the first resistor are electrically connected to the driving power pin and the source terminal, respectively, and two ends of the second resistor are electrically connected to the control source pin and the source terminal, respectively.

18. The wide bandgap semiconductor device with an adjustable voltage level of claim 14, wherein the level adjusting unit is a voltage regulating diode, an anode of the voltage regulating diode is electrically connected to the control source pin, and a cathode of the voltage regulating diode is electrically connected to the source terminal and the driving power pin.

19. The wide bandgap semiconductor device with an adjustable voltage level of claim 14, wherein the level adjusting unit is a second resistor, one end of the second resistor is electrically connected to the control source pin, and the other end of the second resistor is electrically connected to the source terminal and the driving power pin.

* * * * *